OHMIC CONTACTS FOR GALLIUM ARSENIDE SEMICONDUCTORS

Filed Dec. 2, 1966

INVENTOR
Ronald H. Cox
Hans A. Strack
Robert J. Crawford
ATTORNEY

United States Patent Office

3,544,854

Patented Dec. 1, 1970

3,544,854

OHMIC CONTACTS FOR GALLIUM ARSENIDE SEMICONDUCTORS

Ronald H. Cox, Dallas, and Hans A. Strack, Richardson, Tex., assignors to Texas Instruments Incorporated, Dallas, Tex., a corporation of Delaware

Filed Dec. 2, 1966, Ser. No. 598,701

Int. Cl. H01l *3/20, 7/02*

U.S. Cl. 317—234 6 Claims

ABSTRACT OF THE DISCLOSURE

A gallium arsenide semiconductor device is provided with an alloy contact comprising 50–98% by weight silver, 0.5–30% by weight indium, and 0.5–40% by weight dopant. In a preferred embodiment the contact is tin free and the dopant is germanium or zinc.

Figure 1:
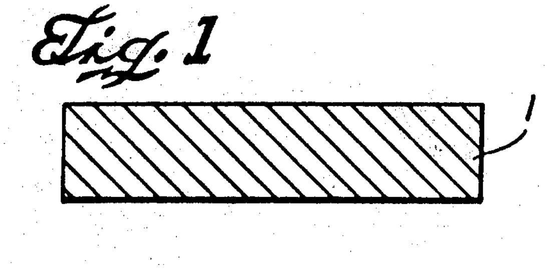

This invention relates to semiconductor materials and devices, and more particularly relates to alloys suitable for making ohmic contacts to such devices.

Gallium arsenide has been successfully used in the fabrication of transistors, Gunn oscillators and related semiconductor devices. Prior art contacts for gallium arsenide devices are generally gold-tin and silver-tin alloys, such as disclosed in U.S. Pat. No. 3,012,175, assigned to the assignee of the present application. The use of these alloys as ohmic contacts with gallium arsenide semiconductor material is disadvantageous in several ways. For example, the tin of such alloys begins to melt at 232° C. and tends to diffuse into the gallium arsenide forming spikes therein which detrimentally affects the current density at the contact and gallium arsenide wafer interface.

It is obviously desirable that the contact when alloyed to the gallium arsenide wafer will produce a planar interface with the wafer to provide an even current distribution. Further, since gallium arsenide devices are most useful at high temperatures, such as for example, 500° C. and above, it is essential that the ohmic contacts for the devices be able to withstand such temperatures. Consequently, it is necessary to develop ohmic contacts for gallium arsenide devices which are planar, tin free, which have high melting temperatures (greater than 500° C.), and which will at the same time exhibit low specific contact resistance and other desirable electrical properties.

It is therfeore an object of the present invention to provide improved ohmic contact alloys.

Another object of the invention is to provide alloys which are particularly suitable for making ohmic contact to gallium arsenide devices.

It is a further object of the invention to provide a single crystal gallium arsenide semiconductor wafer having tin free ohmic contact alloyed thereto, the properties of the contact being such that it will form a planar interface with the semiconductor material, will operate at temperatures above 500° C. without melting and which will have low specific contact resistance for most gallium arsenide devices.

Described briefly, the invention relates to alloys for making ohmic contacts to gallium arsenide. These alloys comprise a silver base material, a wetting agent, and a doping agent to provide the desired impurity level. The wetting agent is included in the alloy to enhance contact fabrication. The most desirable wetting agent is indium which acts to reduce the surface tension of the contact alloy and allows the gallium arsenide surface to accept the contact material more easily. This results in a planar interface between the wafer and the contact which is especially vital where uniform electric fields and current densities are required, as in Gunn oscillators.

The doping agents for the ohmic contact alloys are germanium for N-type gallium arsenide material and zinc for P-type gallium arsenide material.

Other and further objects and features of the present invention will become evident from the following description taken in connection with the accompanying drawing in which FIGS. 1–5 illustrate the main steps in the fabrication of a gallium arsenide wafer having an ohmic contact of this invention alloyed thereto.

It has been found that a tin free alloy composition of 50% to 98% silver, 0.5% to 30% indium, and 0.5% to 40% dopant, when used as the ohmic contacts for a gallium arsenide semiconductor device, bonds to the gallium arsenide device to form a planar metal-semiconductor interface which is necessary for uniform current density, exhibits extremely low specific contact resistance, remains solid to temperatures in excess of 500° C. and therefore can withstand high processing and operating temperatures.

Table 1 below illustrates the test results obtained from ohmic contacts of various specified alloy composition for the N-type contact.

TABLE 1

| Alloy composition (w/o) | Resistivity of GaAs contacted, ohm-cm. | Specific contact resistance, ohm-cm.$^2$ | Melting point of alloyed contact, ° C. |
|---|---|---|---|
| 95Ag-2In-3Ge | 0.3 | $1\times10^{-4}$ | >570 |
| 90Ag-5In-5Ge | 0.1 | $<1\times10^{-4}$ | 600 |
| 90Ag-5In-5Ge | 0.3 | $5\times10^{-4}$ | 600 |
| 90Ag-5In-5Ge | 0.5–2.7 | $1\times10^{-3}$ | 600 |
| 80Ag-10In-10Ge | 1.0 | $6\times10^{-4}$ | ≈570 |
| 80Ag-15In-5Ge | | | ≈570 |
| 80Ag-2In-18Ge | | | ≈570 |
| 70Ag-2In-28Ge | | | ≈570 |
| 70Ag-10In-20Ge | 0.15 | $<1\times10^{-4}$ | ≈570 |
| 74Ag-21In-5Ge | | | ≈570 |
| 70Ag-20In-10Ge | 0.14 | $<1\times10^{-4}$ | 570 |
| 60Ag-30In-10Ge | 0.09 | $1\times10^{-5}$ | 504 |
| 60Ag-20In-20Ge | 0.11 | $<5\times10^{-4}$ | 595 |
| 50Ag-25In-25Ge | 0.22 | $<1\times10^{-4}$ | >600 |
| 50Ag-10In-40Ge | 0.45 | $2\times10^{-4}$ | ---------- |
| 80Ag-10In-10Zn | 0.10 | $<1\times10^{-4}$ | >500 |

It is obvious from the foregoing table that the ohmic contacts have a very low contact resistance. For gallium arsenide wafers having resistivities less than 0.1 ohm-cm., the specific contact resistance becomes so small that it may be considered negligible. For wafers having resistivity in the range of about 0.3 ohm-cm., such as Gunn oscillators, it is found that a contact alloy of 90 Ag-5In-5 dopant produces excellent results. In general, the alloys of this invention produce low specific contact resistance for gallium arsenide wafers with resistivities of 0.5 ohm-cm. and higher.

Further, since the contact alloys have melting points of greater than 500° C., the contacts do not melt during subsequent processing steps such as mounting of the devices on headers, bonding leads to the devices or overcoating the devices with protective oxides such as silicon oxide, some of such processing steps easily exceeding 450° C.

Contact fabrication is easily accomplished by thermo-evaporation and alloying, a technique well known in the prior art. This conventional technique was utilized to fabricate the ohmic contacts illustrated in Table 1 above. By way of example only, FIGS. 1 through 5 of the drawing illustrate the main steps in the fabrication of contacts to gallium arsenide semiconductor devices utilizing the thermo-evaporation technique.

Figure 2:
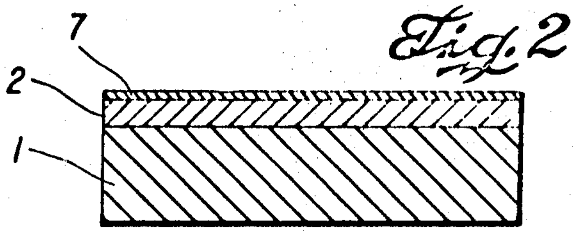
Figure 3:
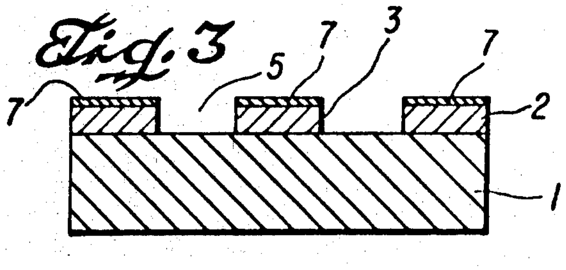
Figure 4:
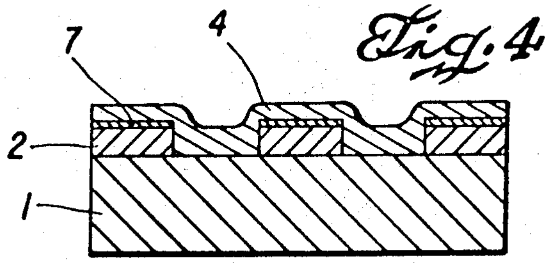
Figure 5:
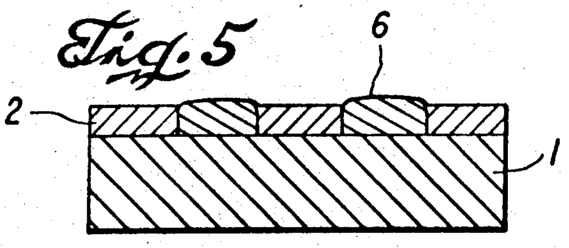

FIG. 1 illustrates a gallium arsenide material to be contacted. The material is first cleaned using a cleaning agent such as $8H_2SO_4{:}H_2O_2{:}H_2O$, then rinsed in deionized $H_2O$. As illustrated in FIG. 2, a silicon oxide coating 2 of approximately 3,000 angstroms thickness is formed on the clean slice by the reactive decomposition of tetraethylorthosilicate. Kodak metal etch resist (KMER), available commercially from Eastman Kodak Company, Rochester, N.Y., is applied to the $SiO_2$ layer as shown at 7, and conventional metal etch techniques are then used to cut windows in the silicon oxide as shown at 3 in FIG. 3. The exposed gallium arsenide portions as shown at 5 in FIG. 3 are then cleaned with $8H_2SO_4:H_2O_2:H_2O$, rinsed in deionized water, cleaned with ethylene diamine tetracidic acid and then rinsed again in deionized $H_2O$. The slices to be contacted are mounted on a suitable carrier such as an aluminum plate and placed in a bell jar. The bell jar is evacuated to a pressure of $5\times10^{-7}$ torr, and a heater behind the aluminum carrier plate is turned on. The metal contact alloy is evaporated from a resistance heated boat onto the gallium arsenide slice at a slice temperature of about 150° to 200° C. A metallized layer so produced is illustrated at 4 in FIG. 4 of the drawing. The excess metal is removed by treating the slice with KMER stripper, J–100, also available from Eastman Kodak Company. The KMER and excess metal come off together, leaving the contacts in place on the resultant GaAs. The contacted slice is then alloyed from 1 to 5 minutes at 610° C. A protective atmosphere of forming gas is used during the alloying process. FIG. 5 illustrates contacts 6 in their final form.

It is to be understood that although the invention has been described with specific reference to particular embodiments thereof, it is not to be so limited since changes and alterations therein may be made which are within the full intended scope of this invention as defined by the appended claims.

What is claimed is:

1. A semiconductor device comprising a wafer of gallium arsenide semiconductor material and an ohmic contact alloyed to said wafer, said ohmic contact comprising an alloy of 50% to 98% by weight silver, .5% to 30% by weight indium, and .5% to 40% by weight dopant, said dopant being selected from the group of germanium and zinc.

2. A semiconductor device as defined in claim 1 wherein the ohmic contact alloy comprises about 90% by weight silver, 5% by weight indium, and 5% by weight dopant.

3. A semiconductor device as in claim 1 wherein said gallium arsenide semiconductor has a resistivity of less than .5 ohm-cm.

4. A semiconductor device as in claim 1 wherein said gallium arsenide seimconductor has a resistivity of less than .1 ohm-cm.

5. A semiconductor device as in claim 2 wherein said gallium arsenide semiconductor material has a resistivity of about .3 ohm-cm. and said dopant is germanium.

6. A semiconductor device comprising a wafer of gallium arsenide semiconductor material and a tin free ohmic contact alloyed to said wafer, said ohmic contact consisting essentially of an alloy of 50 percent to 98 percent by weight silver, .5 to 30 percent by weight indium, and .5 to 40 percent by weight dopant.

References Cited

UNITED STATES PATENTS

| | | | |
|---|---|---|---|
| 2,825,667 | 3/1958 | Mueller | 317—235 |
| 2,830,239 | 4/1958 | Jenny | 317—237 |
| 3,154,446 | 10/1964 | Jones | 148—189 |
| 3,224,911 | 12/1965 | Williams et al. | 317—237 |
| 3,225,273 | 12/1965 | Bakker et al. | 317—237 |

JAMES D. KALLAM, Primary Examiner

U.S. Cl. X.R.

317—237